US012002667B2

(12) United States Patent
Shinada et al.

(10) Patent No.: US 12,002,667 B2
(45) Date of Patent: Jun. 4, 2024

(54) SPUTTERING APPARATUS AND METHOD OF CONTROLLING SPUTTERING APPARATUS

(71) Applicant: TOKYO ELECTRON LIMITED, Tokyo (JP)

(72) Inventors: Masato Shinada, Tokyo (JP); Tetsuya Miyashita, Yamanashi (JP); Einstein Noel Abarra, Tokyo (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 17/556,025

(22) Filed: Dec. 20, 2021

(65) Prior Publication Data

US 2022/0208534 A1 Jun. 30, 2022

(30) Foreign Application Priority Data

Dec. 24, 2020 (JP) .................................. 2020-215671

(51) Int. Cl.
| | |
|---|---|
| *H01J 37/34* | (2006.01) |
| *C23C 14/34* | (2006.01) |
| *C23C 14/50* | (2006.01) |
| *C23C 14/54* | (2006.01) |
| *H01J 37/32* | (2006.01) |

(52) U.S. Cl.
CPC .......... *H01J 37/3441* (2013.01); *C23C 14/34* (2013.01); *C23C 14/50* (2013.01); *C23C 14/54* (2013.01); *H01J 37/32715* (2013.01)

(58) Field of Classification Search
CPC ............ H01J 37/3441; H01J 37/32715; H01J 37/3447; C23C 14/34; C23C 14/50; C23C 14/54; C23C 14/044
See application file for complete search history.

(56) References Cited

U.S. PATENT DOCUMENTS

| | | | | |
|---|---|---|---|---|
| 5,174,875 | A | * 12/1992 | Hurwitt | C23C 14/345 |
| | | | | 204/298.18 |
| 6,425,988 | B1 | * 7/2002 | Montcalm | G02B 1/10 |
| | | | | 427/9 |

(Continued)

FOREIGN PATENT DOCUMENTS

| | | | |
|---|---|---|---|
| JP | S6115964 A | * | 1/1986 |
| JP | H0280564 A | * | 3/1990 |

(Continued)

OTHER PUBLICATIONS

JPH0280564A Translation (Year: 1990).*
JPS6115964A Translation (Year: 1986).*
JP-2006037209-A Translation (Year: 2006).*

*Primary Examiner* — Nicholas A Smith
*Assistant Examiner* — Patrick S Ott
(74) *Attorney, Agent, or Firm* — Fenwick & West LLP

(57) ABSTRACT

There is provided a sputtering apparatus comprising: a target from which sputtered particles are emitted; a substrate support configured to support a substrate; a substrate moving mechanism configured to move the substrate in one direction; and a shielding member disposed between the target and the substrate support and having an opening through which the sputtered particles pass. The shielding member includes a first shielding member and a second shielding member disposed in a vertical direction.

13 Claims, 13 Drawing Sheets

(56) References Cited

U.S. PATENT DOCUMENTS

| | | | | |
|---|---|---|---|---|
| 2002/0162740 | A1* | 11/2002 | Wang | C23C 14/027 |
| | | | | 118/723 VE |
| 2003/0010624 | A1* | 1/2003 | Voutsas | C23C 14/165 |
| | | | | 204/298.25 |
| 2004/0050690 | A1* | 3/2004 | Green | H01J 37/3408 |
| | | | | 204/192.12 |
| 2007/0114122 | A1* | 5/2007 | Ishibashi | C23C 14/0617 |
| | | | | 204/192.1 |
| 2010/0155229 | A1* | 6/2010 | Endo | C23C 14/042 |
| | | | | 204/192.12 |
| 2013/0093049 | A1* | 4/2013 | Ananthan | C23C 14/042 |
| | | | | 257/532 |
| 2013/0299345 | A1* | 11/2013 | Abarra | C23C 14/225 |
| | | | | 204/298.11 |
| 2015/0338362 | A1* | 11/2015 | Barstow | C23C 14/06 |
| | | | | 506/12 |
| 2016/0027623 | A1* | 1/2016 | Ishihara | C23C 14/352 |
| | | | | 204/298.07 |
| 2016/0160343 | A1* | 6/2016 | Hirota | C23C 14/352 |
| | | | | 118/623 |

FOREIGN PATENT DOCUMENTS

| | | | |
|---|---|---|---|
| JP | 2006037209 A | * | 2/2006 |
| JP | 2010-020094 A | | 1/2010 |

* cited by examiner

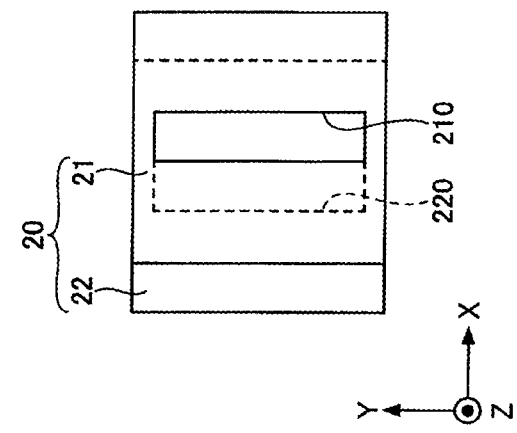
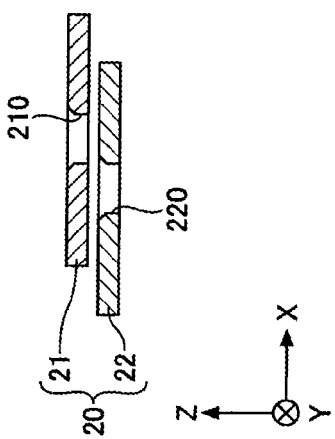
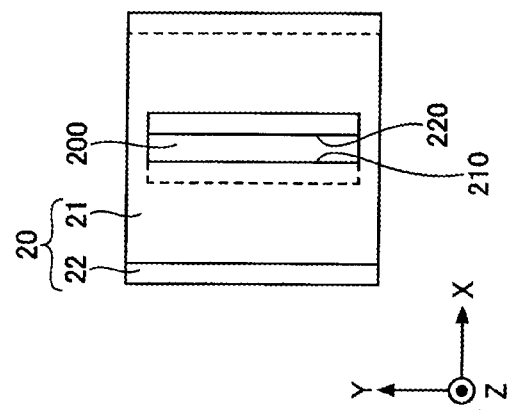
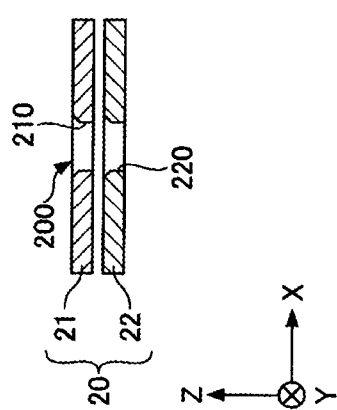
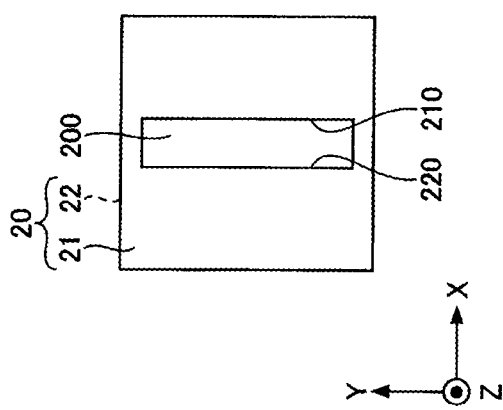
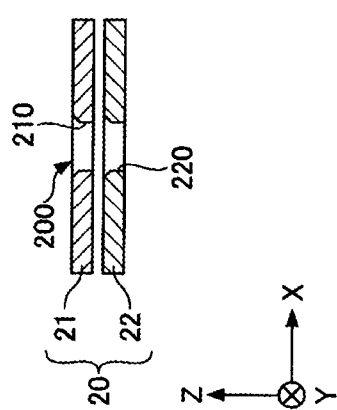

*FIG.12A* *FIG.12B*
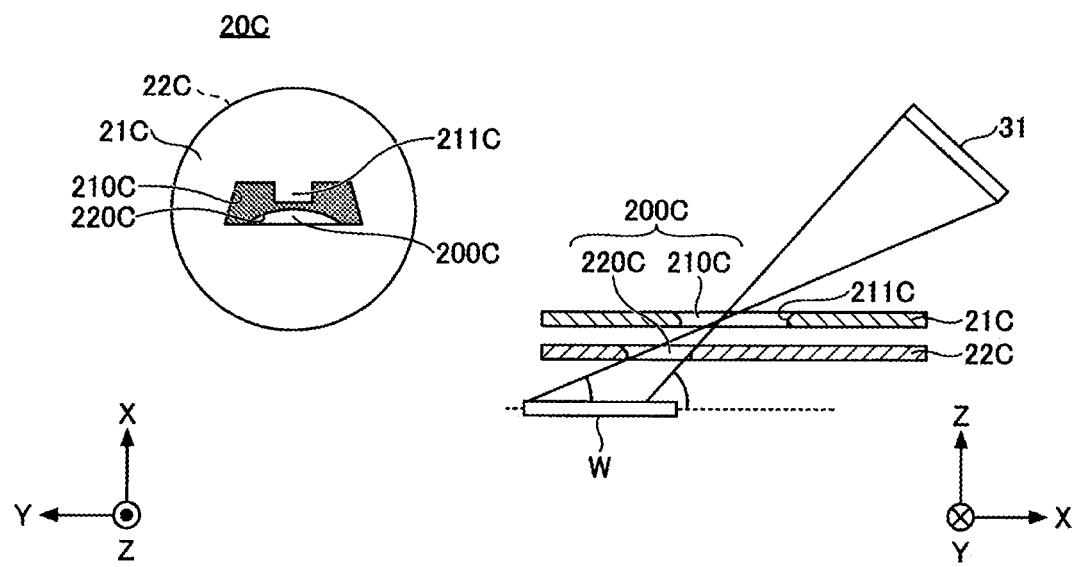
*FIG.12C* *FIG.12D*
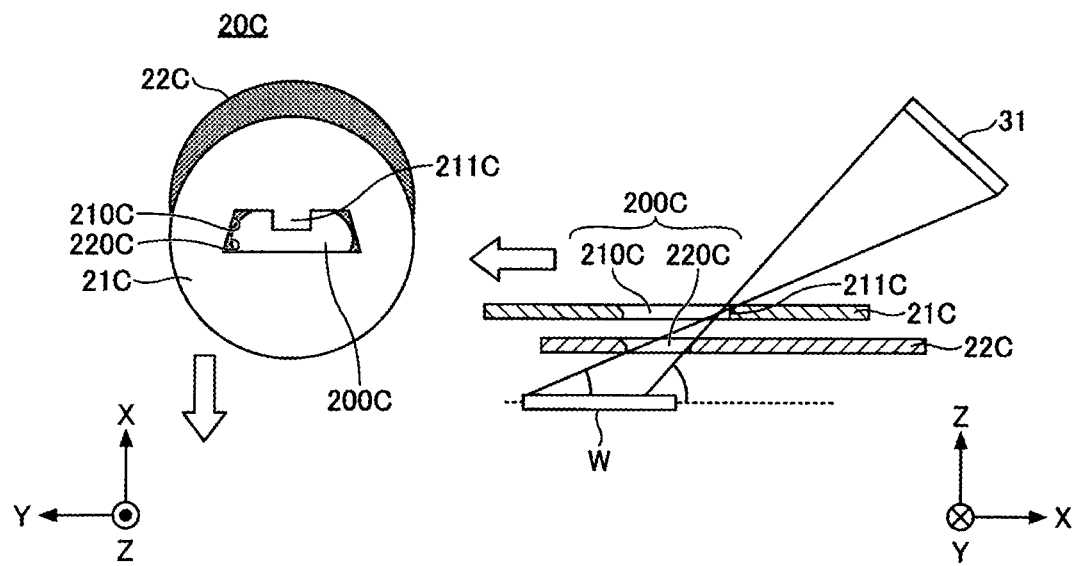

SPUTTERING APPARATUS AND METHOD OF CONTROLLING SPUTTERING APPARATUS

CROSS-REFERENCE TO RELATED APPLICATIONS

This application claims priority to Japanese Patent Application No. 2020-215671 filed on Dec. 24, 2020, the entire contents of which are incorporated herein by reference.

TECHNICAL FIELD

The present disclosure relates to a sputtering apparatus and a method of controlling a sputtering apparatus.

BACKGROUND

A sputtering apparatus in which sputtered particles ejected from a target are incident on a substrate such as a wafer to form a film is known.

Japanese Laid-open Patent Publication No. 2010-020094 discloses a sputtering apparatus including a film forming chamber which houses a substrate held so as to be capable of being carried in a horizontal direction, a sputtered particle ejecting section which generates sputtered particles by plasma from a pair of targets including an upper target and a lower target disposed to face each other and oblique to the substrate and ejects the sputtered particles from an opening to the substrate carried from the upper target side to the lower target side, and a slit member having a slit through which the sputtered particles are selectively passed, the slit member being disposed between the substrate and the sputtered particle ejecting section, wherein, in the slit member, a slit open end of the slit on the upstream side in a transport direction of the substrate is positioned within 50 mm from an upstream open end of the opening of the sputtered particle ejecting section, the slit open end being positioned at an upstream side in a carrying direction of the substrate.

SUMMARY

In a sputtering apparatus in which sputtered particles are obliquely incident on a substrate, it is required to adjust an angle of incidence of the sputtered particles on the substrate.

One aspect of the present disclosure provides a sputtering apparatus and a method of controlling the sputtering apparatus, which may improve the controllability of an angle of incidence of sputtered particles.

In accordance with an aspect of the present disclosure, there is provided a sputtering apparatus comprising: a target from which sputtered particles are emitted; a substrate support configured to support a substrate; a substrate moving mechanism configured to move the substrate in one direction; and a shielding member disposed between the target and the substrate support and having an opening through which the sputtered particles pass. The shielding member includes a first shielding member and a second shielding member disposed in a vertical direction.

BRIEF DESCRIPTION OF THE DRAWINGS

FIGS. 3A to 3F are examples of a plan view and a cross-sectional view of a slit plate of a first embodiment.

FIGS. 12A to 12D are examples of a plan view and a cross-sectional view of the slit plate of the fourth embodiment.

DETAILED DESCRIPTION

Figure 1:
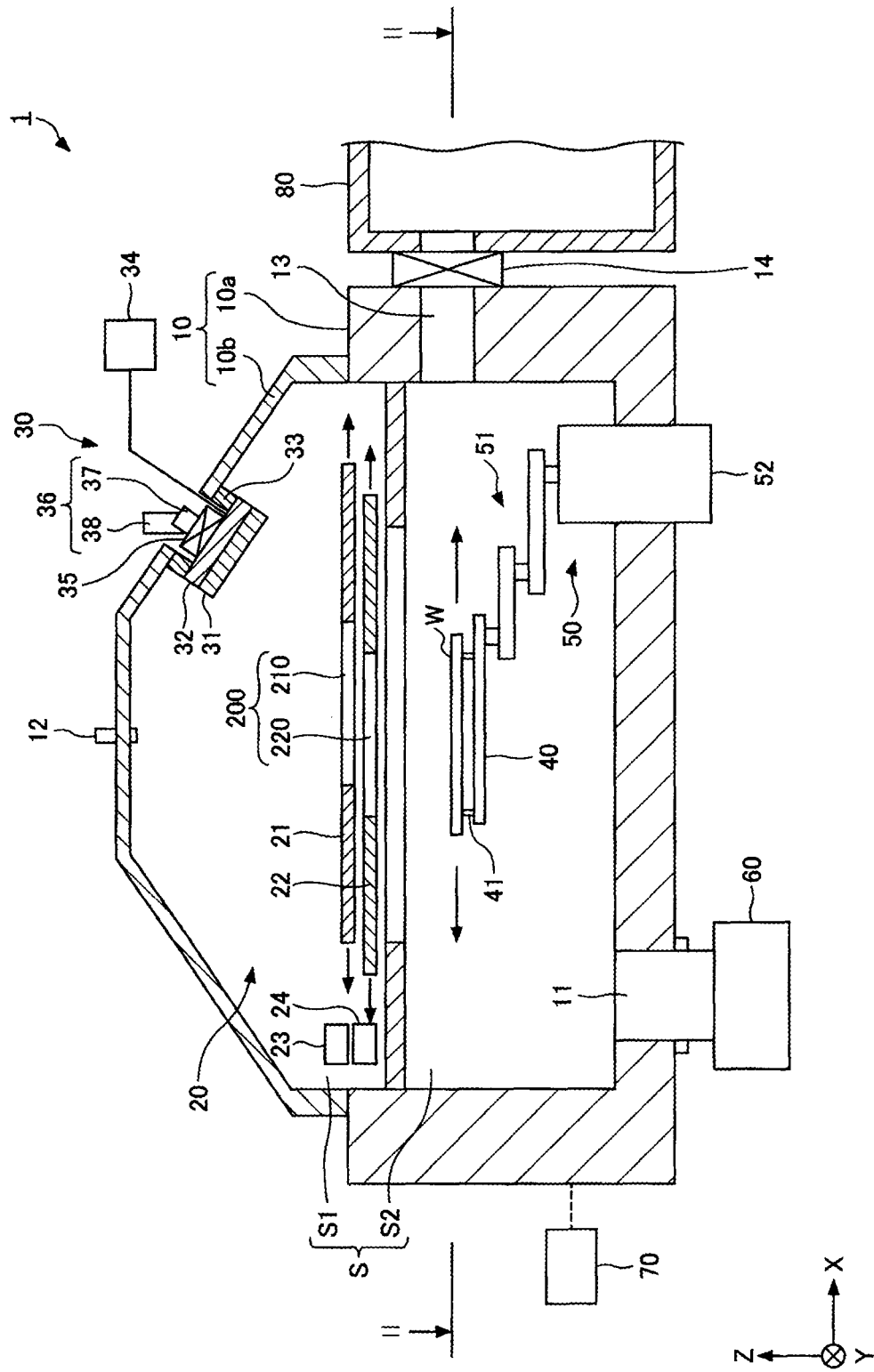
FIG. 1 is an example of a schematic cross-sectional view of a substrate processing apparatus.

Hereinafter, embodiments for implementing the present disclosure will be described with reference to the accompanying drawings. In each drawing, the same components may be designated by the same reference numerals and duplicate description may be omitted.

Figure 2:
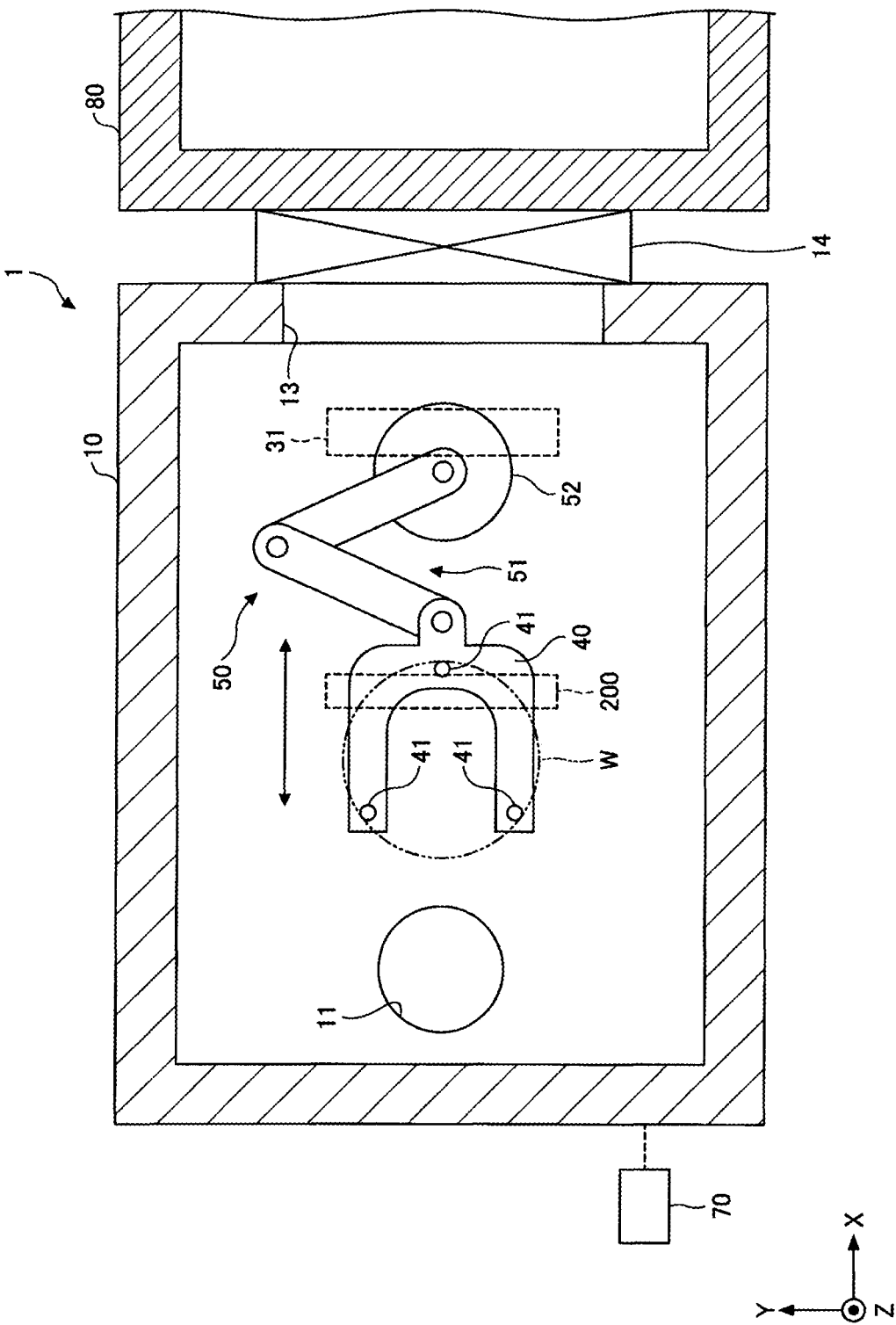
FIG. 2 is an example of a schematic cross-sectional view taken along line II-II of the substrate processing apparatus.

A substrate processing apparatus (a sputtering apparatus) 1 will be described with reference to FIGS. 1 and 2. FIG. 1 is an example of a schematic cross-sectional view of the substrate processing apparatus 1. FIG. 2 is an example of a schematic cross-sectional view taken along line II-II of the substrate processing apparatus 1. In the following description, one direction which is horizontal is referred to as an X direction, a direction which is horizontal and perpendicular to the X direction is referred to as a Y direction, and a vertical direction is referred to as an Z direction.

The substrate processing apparatus 1 includes a processing chamber 10, a shielding member 20, a sputtered particle emitter 30, a substrate support 40, a substrate transfer mechanism 50, and an exhaust device 60. The substrate processing apparatus 1 is, for example, a physical vapor deposition (PVD) apparatus and is a sputtering apparatus which attaches sputtered particles (film forming atoms) emitted from the sputtered particle emitter 30 to a surface of a substrate W such as a semiconductor wafer placed on the substrate support 40 and forms a film in the processing chamber 10.

The processing chamber 10 includes a chamber main body 10a of which an upper portion is open, and a cover 10b provided to close the upper opening of the chamber main body 10a. A side surface of the cover 10b is formed as an inclined surface. The inside of the processing chamber 10 is a processing space S in which a film forming process is performed.

An exhaust port 11 is formed in a bottom portion of the processing chamber 10. The exhaust device 60 is connected to the exhaust port 11. The exhaust device 60 includes a pressure control valve and a vacuum pump. The processing space S is vacuum-exhausted to a predetermined degree of vacuum by the exhaust device 60.

A gas introduction port 12 for introducing a gas into the processing space S is inserted into a top portion of the processing chamber 10. A gas supply (not shown) is connected to the gas introduction port 12. A sputtering gas (for example, an inert gas) supplied from the gas supply to the gas introduction port 12 is introduced into the processing space S.

A loading and unloading port 13 for loading and unloading the substrate W is formed in a side wall of the processing chamber 10. The loading and unloading port 13 is opened or closed by a gate valve 14. The processing chamber 10 is provided adjacent to a transport chamber 80, and the processing chamber 10 and the transport chamber 80 are allowed to communicate with each other by opening the gate valve 14. The inside of the transport chamber 80 is maintained at a predetermined degree of vacuum, and a transport device (not shown) for loading and unloading the substrate W into/from the processing chamber 10 is provided therein.

The shielding member 20 is configured as a substantially plate-shaped member, and is horizontally disposed at an intermediate position in a height direction of the processing space S. An edge portion of the shielding member 20 is fixed to the side wall of the chamber main body 10a. The shielding member 20 divides the processing space S into a first space S1 and a second space S2. The first space S1 is a space above the shielding member 20. The second space S2 is a space below the shielding member 20.

The shielding member 20 includes a first plate 21, a second plate 22, and a third shielding member, wherein an edge portion of the third shielding member is fixed to the side wall of the chamber main body 10a. The first plate 21 has an opening (a first opening) 210 through which sputtered particles pass. The opening 210 passes through the first plate 21 in a plate thickness direction (the Z direction). The second plate 22 has an opening (a second opening) 220 through which sputtered particles pass. The opening 220 passes through the second plate 22 in the plate thickness direction (the Z direction). The first plate 21 and the second plate 22 are disposed to overlap each other in the vertical direction (the Z direction). A slit (an opening) 200 of the shielding member 20 is formed by the opening 210 of the first plate 21 and the opening 220 of the second plate 22. The slit 200 is formed in a thin elongated shape of which a longitudinal direction is the Y direction which is one horizontal direction in the drawing. Further, a length of the slit 200 in the Y direction is formed to be longer than a diameter of the substrate W. The shielding member 20 and the slit 200 will be described below with reference to FIGS. 3A to 3F and the like.

Further, the substrate processing apparatus 1 includes a first driver 23 for driving (transferring and/or rotating) the first plate 21 and a second driver 24 for driving (transferring and/or rotating) the second plate 22. The drivers 23 and 24 are controlled by a controller 70. The drivers 23 and 24 will be described below with reference to FIGS. 3A to 3F and the like.

The sputtered particle emitter 30 includes a target 31, a target holder 32, an insulating member 33, a power supply 34, a magnet 35, and a magnet scanning mechanism 36.

The target 31 is made of a material containing a constituent element of a film to be formed, and the material may be a conductive material or a dielectric material.

The target holder 32 is made of a conductive material, is disposed above the shielding member 20, and is attached to an inclined surface of the cover 10b of the processing chamber 10 via the insulating member 33. In an example shown in FIG. 1, the target holder 32 is provided on the inclined surface of the cover 10b between the gate valve 14 and the slit 200 but is not limited thereto, and may be provided at positions facing each other with the slit 200 interposed therebetween, and may be provided at any position. The target holder 32 holds the target 31 on a front side of the target holder 32 so that the target 31 is located diagonally above the slit 200.

The power supply 34 is electrically connected to the target holder 32. The power supply 34 may be a direct current (DC) power supply when the target 31 is a conductive material, and may be a high frequency power supply when the target 31 is a dielectric material. When the power supply 34 is a high frequency power supply, it is connected to the target holder 32 via a matching device. When a voltage is applied to the target holder 32, the sputtering gas is dissociated around the target 31. Then, ions in the dissociated sputtering gas collide with the target 31, and the sputtered particles which are particles of the constituent material are emitted from the target 31.

The magnet 35 is disposed on the back surface side of the target holder 32 and is configured to be able to reciprocate (swing) in the Y direction by the magnet scanning mechanism 36. The magnet scanning mechanism 36 has, for example, a guide 37 and a driver 38. The magnet 35 is guided by the guide 37 so that it can reciprocate in the Y direction. The driver 38 causes the magnet 35 to reciprocate along the guide 37.

The ions in the dissociated sputtering gas are moved toward the magnet 35 by a magnetic field of the magnet 35 and collide with the target 31. When the magnet scanning mechanism 36 causes the magnet 35 to reciprocate in the Y direction, a position at which the ions collide with the target 31, in other words, a position at which the sputtered particles are emitted changes.

The substrate support 40 is provided in the chamber main body 10a of the processing chamber 10 and horizontally supports the substrate W via support pins 41. The substrate support 40 can be linearly moved in the X direction, which is one horizontal direction, by the substrate transfer mechanism 50. Therefore, the substrate W supported by the substrate support 40 is able to linearly move in a horizontal plane by the substrate transfer mechanism 50. The substrate transfer mechanism 50 includes an articulated arm 51 and a driver 52 and can move the substrate support 40 in the X direction by driving the articulated arm 51 with the driver 52.

That is, the transfer direction (the Y direction) of the magnet 35 and the transfer direction (the X direction) of the substrate W are orthogonal to each other. Further, the sputtered particle emitter 30 is disposed on one side when seen in the transfer direction (the X direction) of the substrate W.

The controller 70 comprises a computer and controls each component of the substrate processing apparatus 1, for example, the drivers 23 and 24, the power supply 34, the driver 38, the driver 52, the exhaust device 60, and the like. The controller 70 includes a main controller comprising a central processing unit (CPU) which actually controls the components, an input device, an output device, a display device, and a storage device. The storage device stores parameters of various processes performed by the substrate processing apparatus 1, and also in the storage device, a program for controlling the processes performed by the substrate processing apparatus 1, that is, a storage medium in which a processing recipe is stored is set. The main controller of the controller 70 calls a predetermined processing recipe stored in the storage medium, and causes the substrate processing apparatus 1 to execute a predetermined process based on the processing recipe.

Next, a film forming method in the substrate processing apparatus 1 will be described.

First, after exhausting is performed on the processing space S in the processing chamber 10, a sputtering gas (for example, an inert gas) is introduced into the processing space S from the gas introduction port 12 and is adjusted to a predetermined pressure.

Next, the substrate support 40 is positioned at a substrate delivery position, the gate valve 14 is opened, and the substrate W is placed on the substrate support 40 (on the support pins 41) by a transport device (not shown) of the transport chamber 80. Next, the transport device is returned to the transport chamber 80, and the gate valve 14 is closed.

Next, the controller 70 controls the substrate transfer mechanism 50 (the driver 52) to move the substrate W on the substrate support 40 in the X direction and controls the sputtered particle emitter 30 (the power supply 34, the driver 38) to obliquely emit sputtered particles from the target 31.

Here, the sputtered particles are emitted by applying a voltage from the power supply 34 to the target holder 32 and causing the ions in the sputtered gas dissociated around the target 31 to collide with the target 31. Further, the position at which the ions collide with the target 31, in other words, the position at which the sputtered particles are emitted, is changed by the magnet scanning mechanism 36 causing the magnet 35 to reciprocate in the Y direction.

The sputtered particles obliquely emitted from the target 31 of the sputtered particle emitter 30 pass through the slit 200 formed in the shielding member 20, are obliquely incident on the substrate W and are deposited on the substrate W. The angle of incidence of the sputtered particles is limited by the sputtered particles passing through the slit 200, and a film having directivity can be formed.

For example, an uneven part such as a trench is formed on the surface of the substrate W. The substrate processing apparatus 1 emits sputtered particles from the target 31 so as to form a film while transferring the substrate W in the transport direction, and selectively forms a film on corner portions of a convex part of the substrate W in one direction. As a result, a film can be selectively formed on the convex part of the substrate W.

Shielding Member 20 of First Embodiment

Next, the shielding member 20 of the substrate processing apparatus 1 according to a first embodiment will be described with reference to FIGS. 3A to 3F. FIGS. 3A to 3F are examples of a plan view and a cross-sectional view of the shielding member 20 of the first embodiment. FIGS. 3A, C, and E are plan views of the shielding member 20 when seen from above, and FIGS. 3B, D, and F are cross-sectional views of the shielding member 20. Further, FIGS. 3A and 3B show a state in which the slit 200 is opened, FIGS. 3C and 3D show a state in which the slit 200 is half-opened, and FIGS. 3E and 3F show a state in which the slit 200 is closed.

The shielding member 20 according to the first embodiment includes a first plate (a first shielding member) 21 and a second plate (a second shielding member) 22. An elongated rectangular opening 210 of which a longitudinal direction is the Y direction is formed in the first plate 21. Further, a thin elongated rectangular opening 220 of which a longitudinal direction is the Y direction is formed in the second plate 22.

Further, the first driver 23 moves the first plate 21 in the X direction. That is, the first plate 21 moves in a uniaxial direction (the X direction). Further, the second driver 24 moves the second plate 22 in the X direction. That is, the second plate 22 moves in a uniaxial direction (the X direction).

With such a configuration, the substrate processing apparatus 1 moves the first plate 21 and the second plate 22 relative to each other, and thus as shown in FIGS. 3A and B and FIGS. 3C and D, an opening width of the slit 200 in a transverse direction (the transport direction of the substrate W, the X direction) can be adjusted. Further, as shown in FIGS. 3E and 3F, a function as a shutter can be achieved by closing the slit 200.

Further, the substrate processing apparatus 1 can change a distance between the target 31 and the slit 200 in the X direction by moving the first plate 21 and the second plate 22 together. Thus, the angle of incidence of sputtering particles which pass through the slit part 200 and are obliquely incident on the substrate W can be adjusted.

Shielding Member 20A of Second Embodiment

Figure 4A:
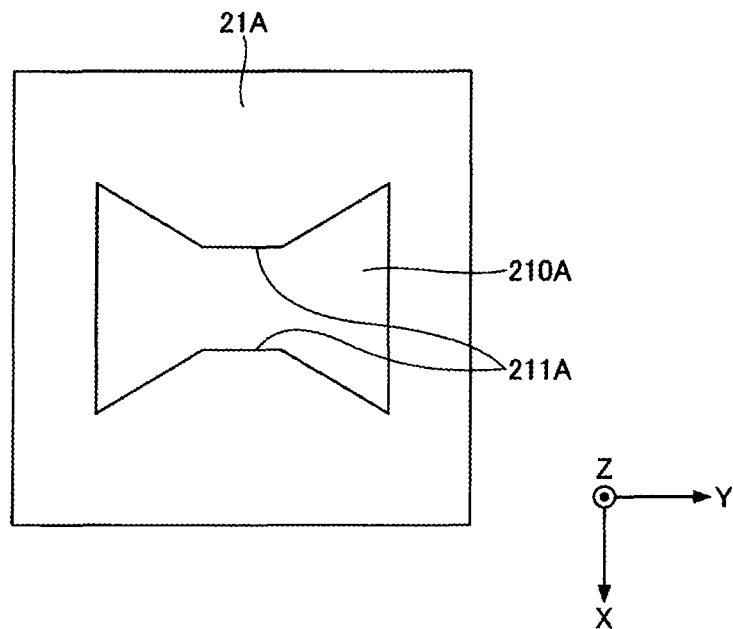
FIGS. 4A and 4B are examples of a plan view of a first plate and a second plate of a second embodiment.
Figure 4B:
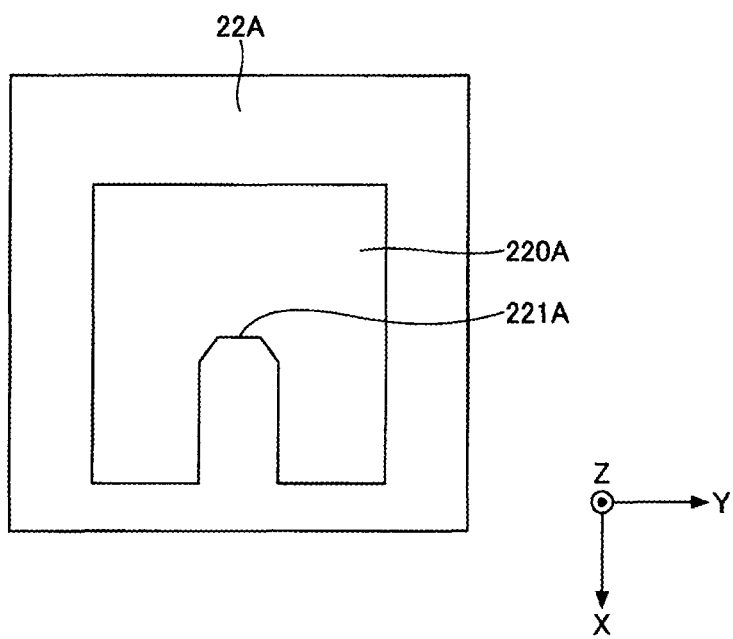
Figure 5A:
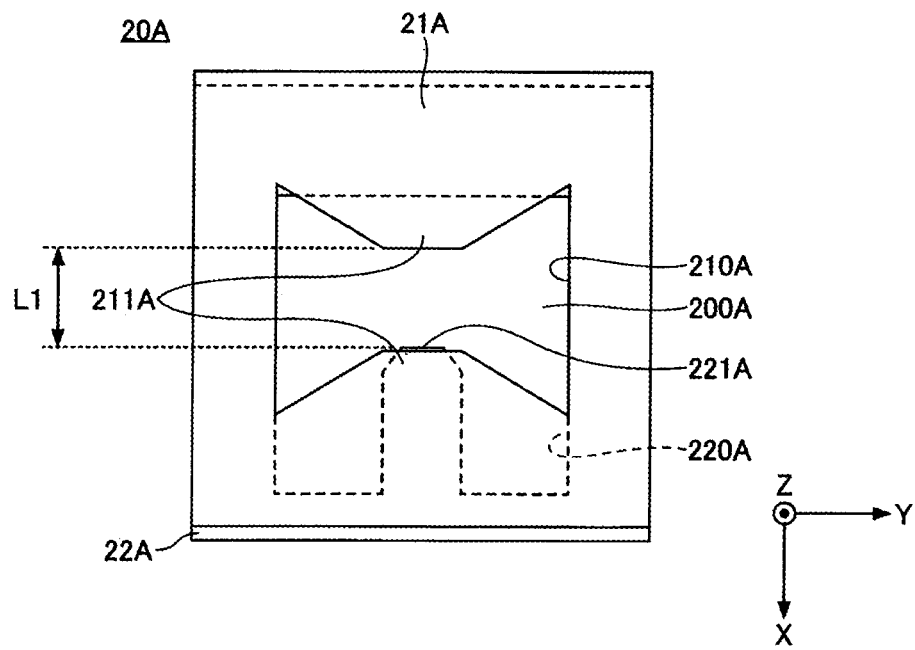
FIGS. 5A and 5B are examples of a plan view of a slit plate of the second embodiment.
Figure 5B:
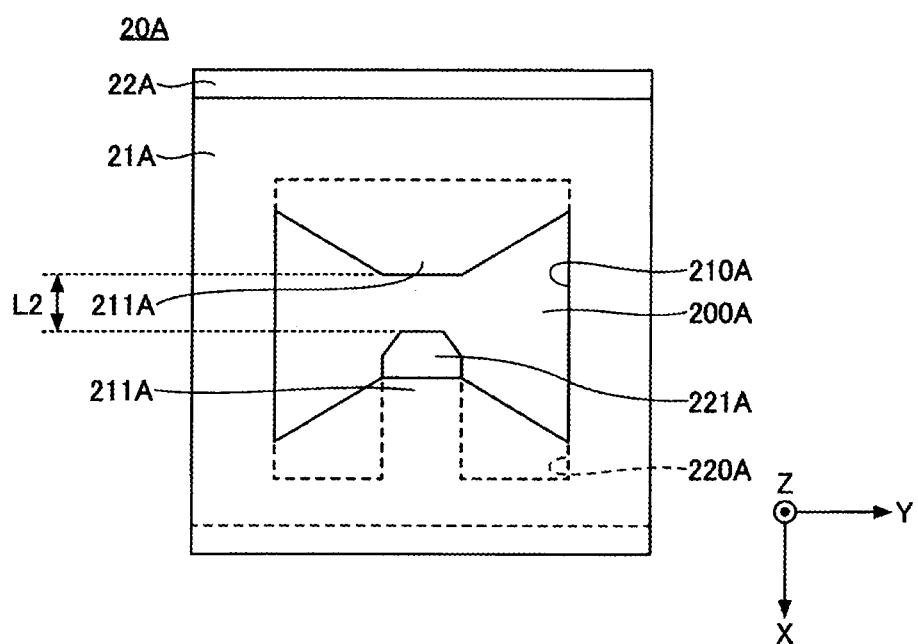

Next, a shielding member 20A of the substrate processing apparatus 1 according to a second embodiment will be described with reference to FIGS. 4 to 7. FIGS. 4A and 4B are examples of a plan view of a first plate 21A and a second plate 22A of the second embodiment. FIGS. 5A and 5B are examples of a plan view of the shielding member 20A of the second embodiment.

The shielding member 20A according to the second embodiment includes the first plate (the second shielding member) 21A and the second plate (the first shielding member) 22A.

As shown in FIG. 4A, a thin elongated rectangular opening part 210A of which a longitudinal direction is the Y direction is formed in the first plate 21A. Further, at the edges of the opening part 210A on both sides in the X direction, protruding parts 211A are formed at center portions in the Y direction. An opening shape (an opening area) of the opening part 210A is adjusted by forming the protruding parts 211A to protrude toward the opening part 210A. In other words, an opening width of the opening part 210A in the X direction is formed to be narrow at the center portion in the Y direction and to be wide at both end sides in the Y direction.

Here, the ions are pulled by the magnetic field of the magnet 35 that reciprocates and collide with a sputtering surface of the target 31, by which sputtered particles are emitted from the target 31. Therefore, an amount of emission of the sputtered particles increases in the center portion in the Y direction rather than both end sides in the Y direction. Due to the first plate 21A having the opening 210A which is narrow at the center portion in the Y direction and is wide at both end sides in the Y direction, it is possible to adjust the sputtered particles which pass through the opening 210A and to adjust a film thickness distribution of a film formed on the substrate W.

As shown in FIG. 4B, a rectangular opening 220A which is wide in the X direction and the Y direction is formed in the second plate 22A. Further, at an edge of the opening 220A on one side in the X direction, a protruding part 221A is formed at a center portion in the Y direction. The protruding part 221A is formed to protrude toward the opening 220A.

Further, the first driver 23 moves the first plate 21A in the X direction. That is, the first plate 21A moves in a uniaxial direction (the X direction). Further, the second driver 24 moves the second plate 22A in the X direction. That is, the second plate 22A moves in the uniaxial direction (the X direction).

FIG. 5A shows a state in which the slit 200A of the shielding member 20A is open. FIG. 5B shows a state in which the second plate 22A is moved.

In FIG. 5A, the protruding part 221A is disposed to be covered by the first plate 21 when seen from the target 31. In other words, the protruding part 221A is disposed not to block the slit 200A or to barely block the slit 200A.

In FIG. 5B, the protruding part 221A is disposed to protrude to the slit 200A and to close a part of the slit 200A when seen from the target 31.

With such a configuration, the substrate processing apparatus 1 moves the first plate 21A and the second plate 22A relative to each other, and thus as shown in FIGS. 5A and 5B, the opening width can be narrowed from an opening width L1 to an opening width L2 at the center portion of the slit 200A in the Y direction.

Further, the substrate processing apparatus 1 can change a distance between the target 31 and the slit 200A in the X direction by moving the first plate 21A and the second plate 22A together. Thus, the angle of incidence of the sputtered particles which pass through the slit 200A and are obliquely incident on the substrate W can be adjusted.

Here, the film thickness distribution of the film formed on the substrate by the sputtered particles will be described with reference to FIGS. 6 and 7. FIGS. 6A and 6B are examples of a graph showing the control of electric power supplied to the target 31 and the film thickness distribution.

Figure 6A:
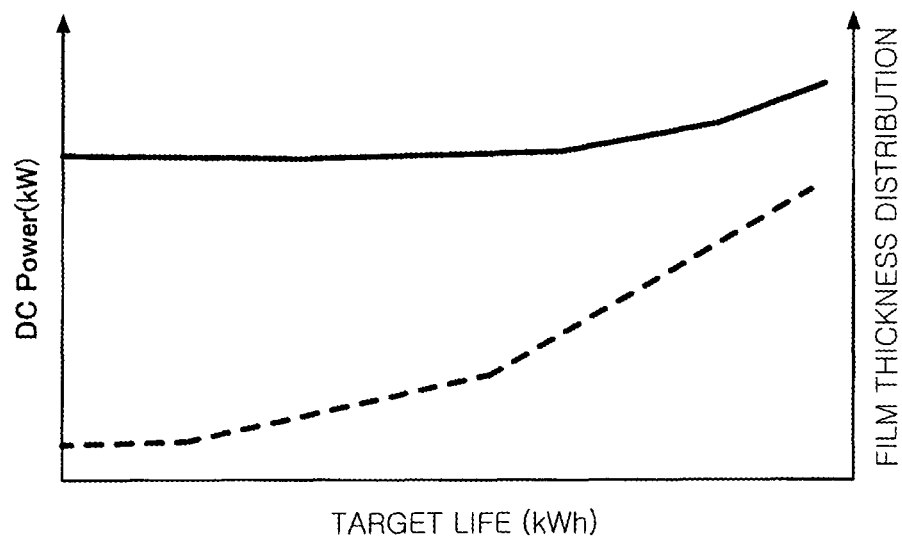
FIGS. 6A and 6B are examples of a graph showing the control of power supplied to a target and a film thickness distribution.

FIG. 6A shows a graph showing the control of electric power supplied to the target 31 and the film thickness distribution in a reference example. In the reference example, a shape of the slit 200A maintains a state shown in FIG. 5A. A broken line indicates the electric power (DC Power) supplied to the target 31, and a solid line indicates the film thickness distribution. Further, a horizontal axis indicates the progress (hereinafter, also referred to as a target life) of consumption (erosion) of the target 31.

Here, the ions are pulled by the magnetic field of the magnet 35 that reciprocates and collide with a sputtering surface of the target 31, by which sputtered particles are emitted from the target 31. Therefore, as the target life progresses (in other words, as the target 31 is consumed), the sputtering surface of the target 31 curves. Thus, an emission direction of the sputtered particles changes, and the sputtered particles which pass through the slit 200 and are incident on the substrate W are reduced. Therefore, the controller 70 increases the electric power supplied from the power supply 34 to the target 31 as the target life progresses such that a deposition rate of the sputtered particles becomes uniform (refer to a broken line in FIG. 6A).

Further, due to the swinging of the magnet 35, the consumption of the target 31 is not uniform on the sputtering surface of the target 31, and both end sides of the target 31 in the Y direction (a swinging direction of the magnet 35) are consumed faster than a center portion thereof. Therefore, both end sides become inclined surfaces, and the sputtered particles which are emitted from the target 31 and reach the substrate W are more reduced on both end sides in the Y direction than at the center portion in the Y direction. That is, the film thickness formed on the substrate W by the sputtered particles is thick at the center portion in the Y direction and is thin at both end sides in the Y direction. Therefore, the film thickness distribution of the substrate W increases (refer to a solid line in FIG. 6A), in other words, uniformity of the film thickness decreases.

Figure 6B:
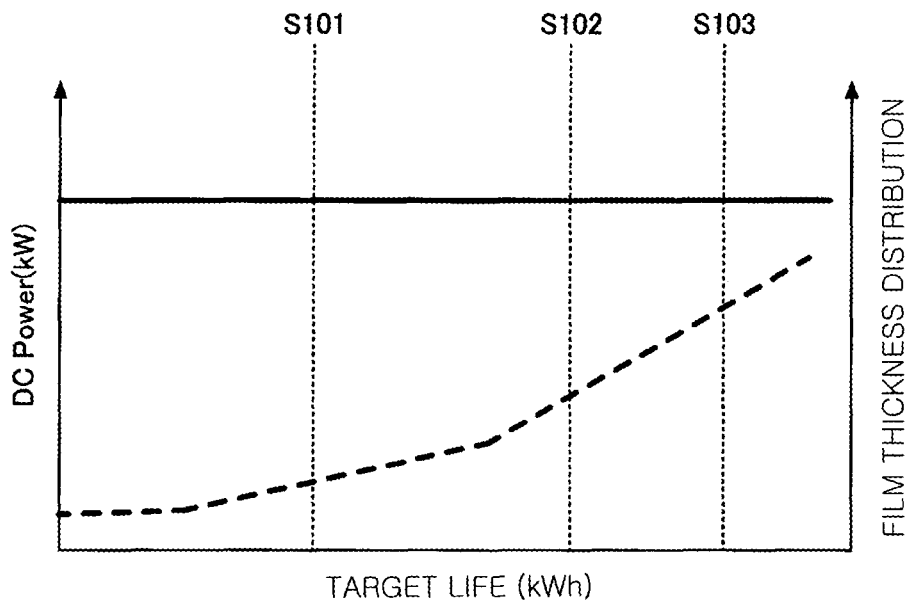
Figure 7A:
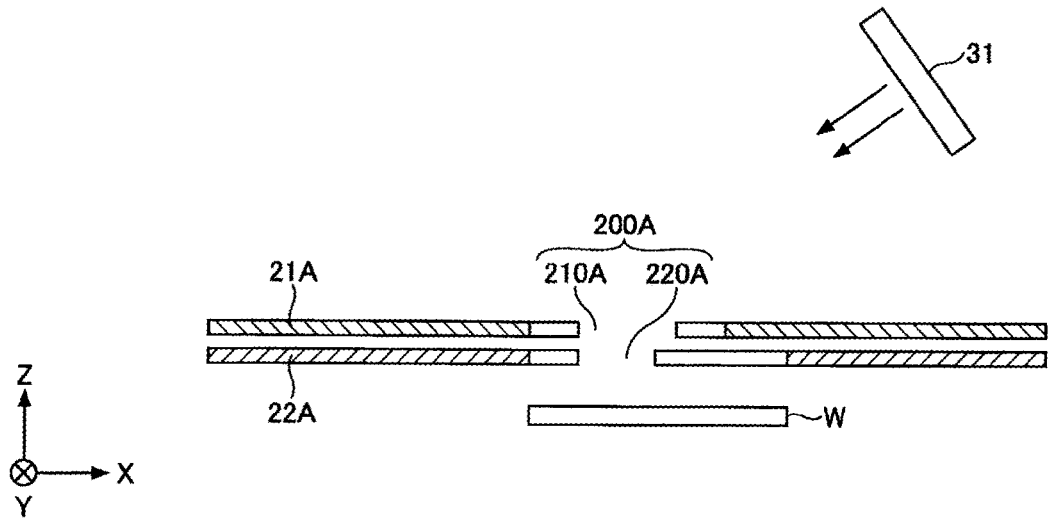
FIGS. 7A to 7C are examples of a cross-sectional view of the slit plate of the second embodiment.
Figure 7B:
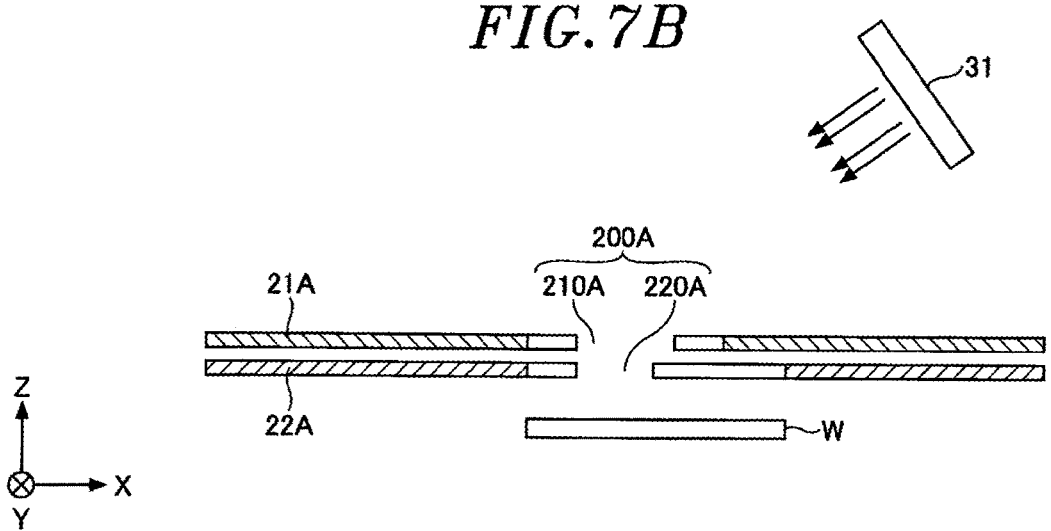
Figure 7C:
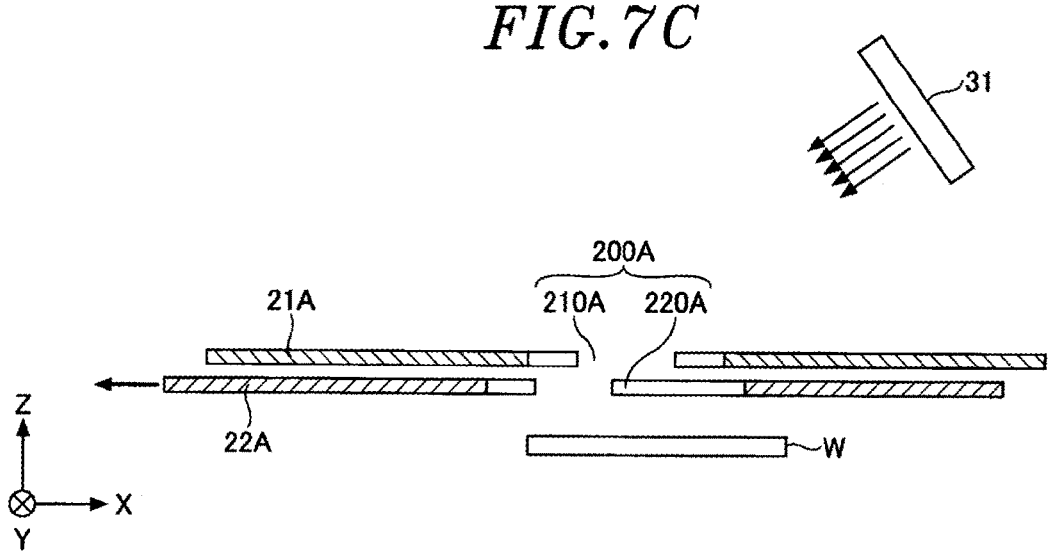

FIG. 6B shows a graph showing the control of electric power supplied to the target 31 and the film thickness distribution in the second embodiment. The broken line indicates the electric power (the DC Power), and the solid line indicates the film thickness distribution. FIGS. 7A to 7C are examples of a cross-sectional view of the shielding member 20A of the second embodiment. FIG. 7A is an example of a cross-sectional view at a time point S101 to which the target life has progressed, FIG. 7B is an example of a cross-sectional view at a time point S102 to which the target life has further progressed, and FIG. 7A is an example of a cross-sectional view at a time point S103 to which the target life has still further progressed.

At the time point S101 to which the target life has progressed, an opening shape of the shielding member 20A is shown in FIG. 5A.

At the time point S102 to which the target life further progresses, the opening shape of the shielding member 20A is also shown in FIG. 5A. Further, the controller 70 increases the electric power to be supplied more than the electric power at the time point S101 as the target life progresses so that the deposition rate becomes uniform (refer to the broken line in FIG. 6B).

At the time point S103 to which the target life has still further progressed, the opening shape of the shielding member 20A is shown in FIG. 5B. Thus, the film thickness distribution is adjusted by lowering the deposition rate at the center portion (refer to the solid line in FIG. 6B). Further, the controller 70 increases the electric power to be supplied more than the electric power at the time point S102 as the target life progresses so that the deposition rate becomes uniform (refer to the broken line in FIG. 6B).

With such a configuration, the substrate processing apparatus 1 moves the second plate 22A according to the progress of the target life. In other words, the protruding part 221A protrudes to the slit 200A when seen from the target 31. Thus, it is possible to suppress an increase in the film thickness distribution due to the progress of the target life (refer to the solid line in FIG. 6B). In other words, the uniformity of the film thickness can be improved.

It has been described that the controller 70 moves the second plate 22A according to the progress of the target life, but the present disclosure is not limited thereto. Further, the controller 70 may move the second plate 22A based on at least one of the electric power (the DC power) supplied to the target 31, a discharge voltage, a current value, and a temperature of cathode cooling water. As described above, the controller 70 increases the electric power, discharge voltage, and current value supplied from the power supply 34 to the target 31 as the target life progresses. Further, as the electric power and the like supplied to the target 31 increases, a temperature of the target 31 also increases, and a temperature of the cooling water which cools a cathode of the sputtered particle emitter 30 also increases. In addition, a torque of the motor of the magnet scanning mechanism changes as the target life progresses. Therefore, control can be performed in the same manner as a case in which the second plate 22A is moved according to the progress of the target life by moving the second plate 22A based on at least one of the electric power supplied to the target 3, the discharge voltage, and the current value, and the temperature of the cathode cooling water 1, and the torque of the motor of the magnet scanning mechanism.

Further, although it has been described that the opening width of the center portion in the Y direction is narrowed by moving the second plate 22A, the present disclosure is not limited thereto. The opening width on both end sides in the Y direction may be widened by moving the second plate 22A.

Shielding Member 20B of Third Embodiment

Figure 8A:
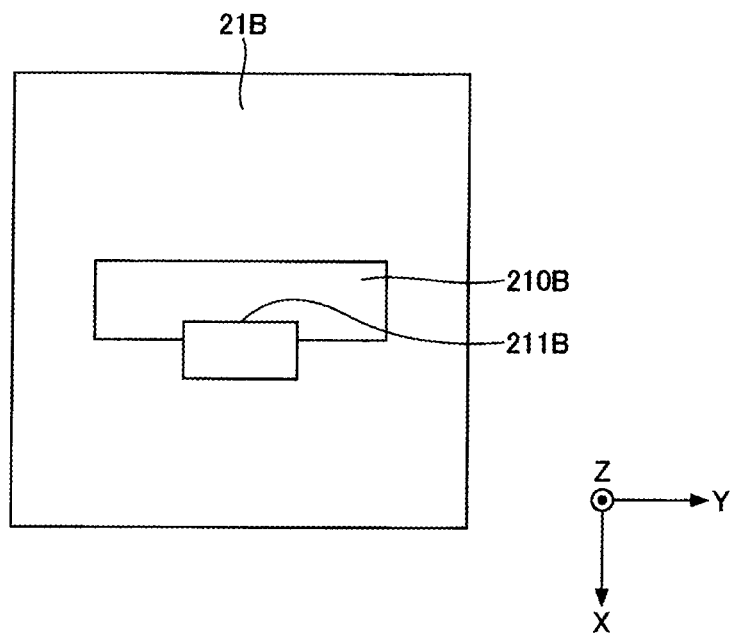
FIGS. 8A and 8B are examples of a plan view of a first plate and a second plate of a third embodiment.
Figure 8B:
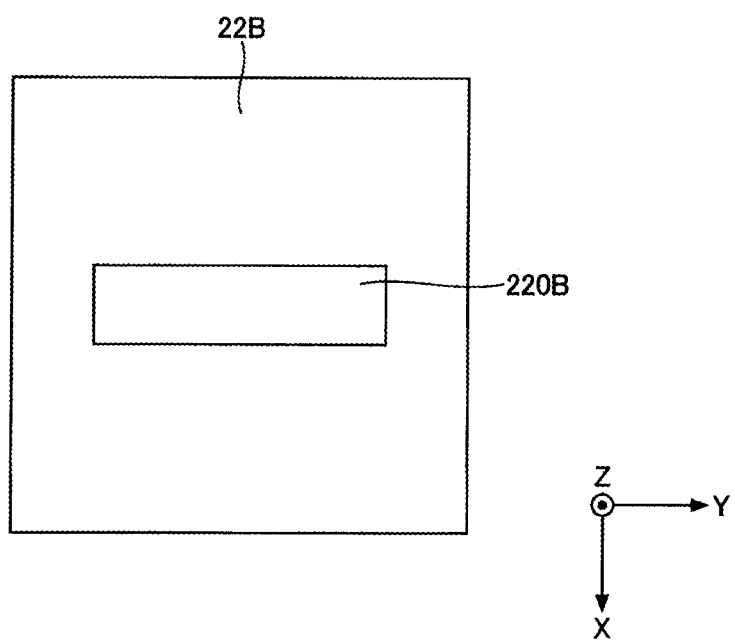
Figure 9A:
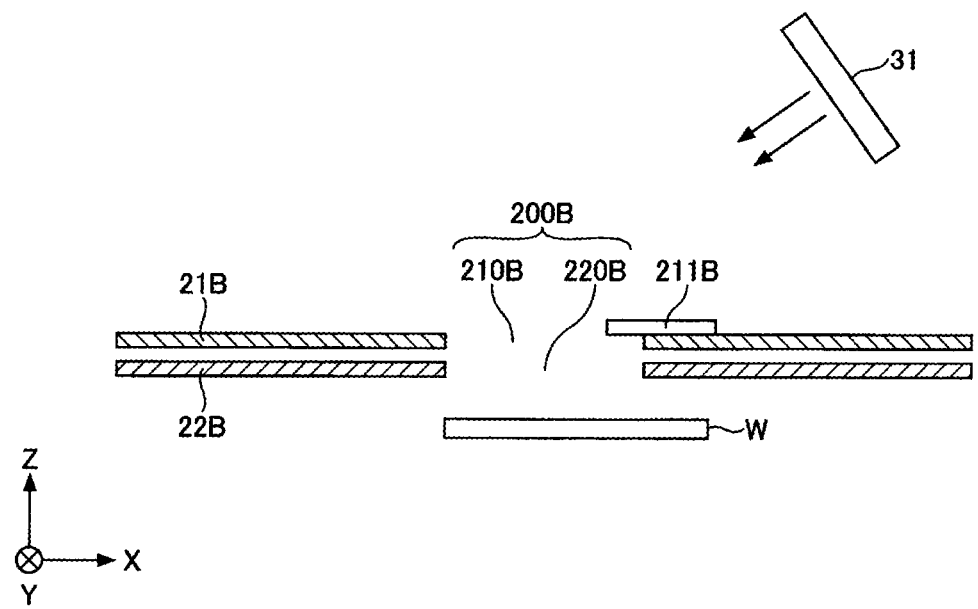
FIGS. 9A and 9B are examples of a cross-sectional view of a slit plate according to the third embodiment.
Figure 9B:
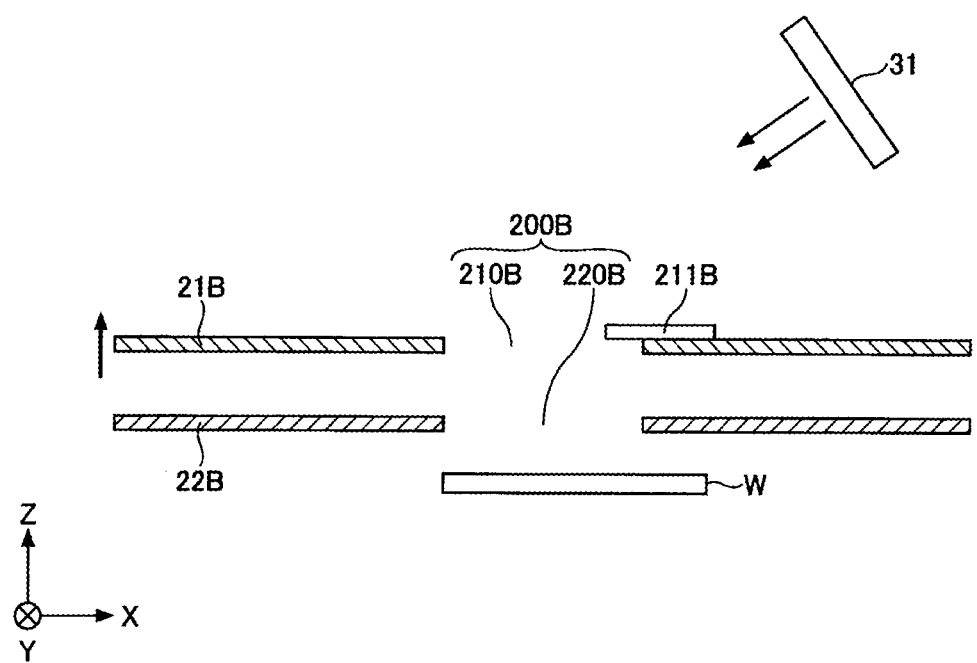
Figure 10A:
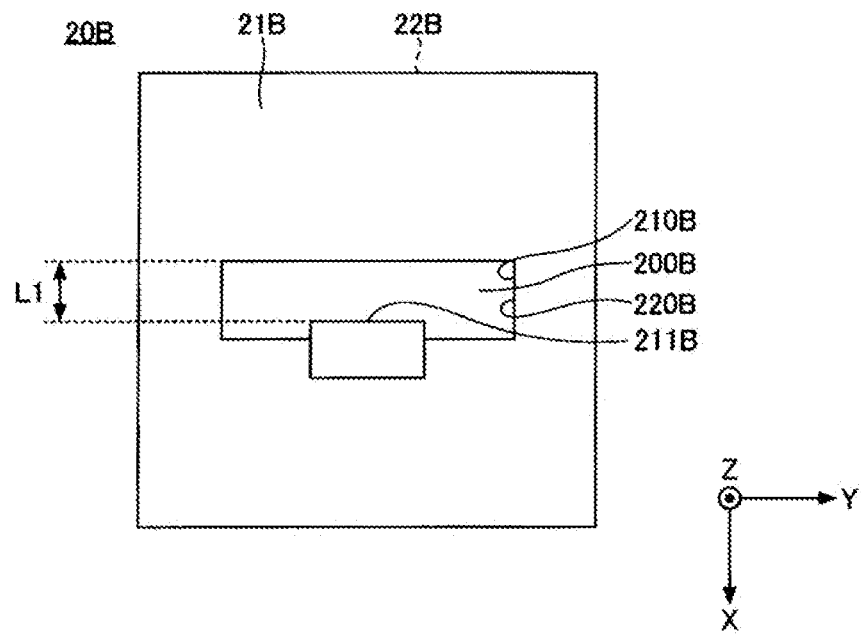
FIGS. 10A and 10B are examples of a plan view of the slit plate according to the third embodiment.
Figure 10B:
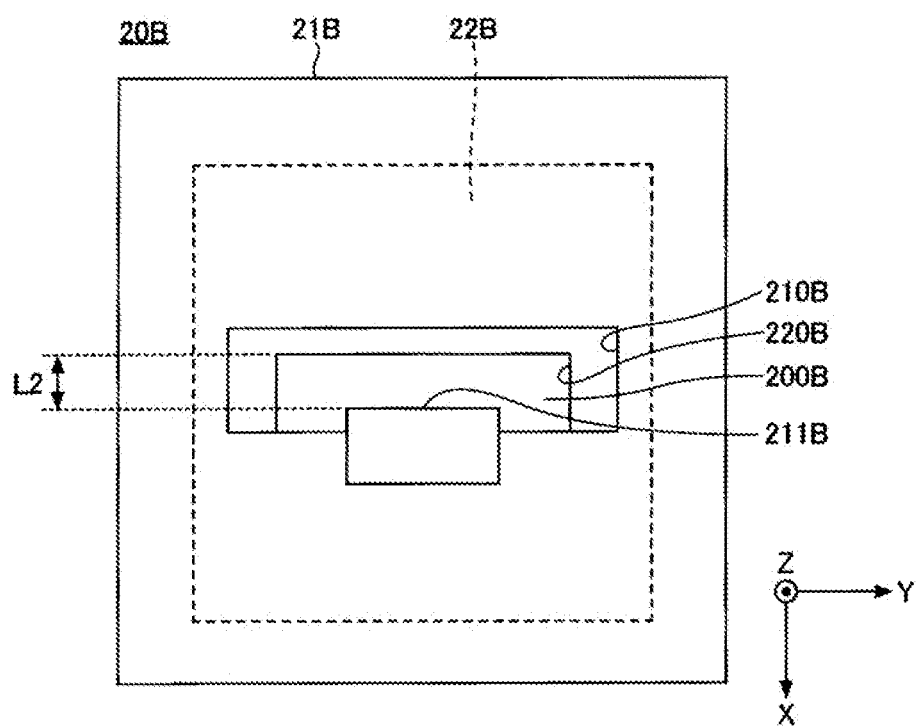

Next, a shielding member 20B of the substrate processing apparatus 1 according to a third embodiment will be described with reference to FIGS. 8 to 10. FIGS. 8A and 8B are examples of a plan view of a first plate 21B and a second plate 22B of the third embodiment. FIGS. 9A and 9B are examples of a cross-sectional view of the shielding member 20B of the third embodiment. FIGS. 10A and 10B are examples of a plan view of the shielding member 20B of the third embodiment.

The shielding member 20B according to the third embodiment includes the first plate (the first shielding member) 21B and the second plate (the second shielding member) 22B.

As shown in FIG. 8A, a thin elongated rectangular opening 210B of which a longitudinal direction is the Y direction is formed in the first plate 21B. Further, at the edges of the opening 210B on both sides in the X direction, a protruding part 211B is formed at a center portion in the Y direction. The protruding part 211B is formed to protrude toward the opening 210B.

As shown in FIG. 8B, a thin elongated rectangular opening 220B of which a longitudinal direction is the Y direction is formed in the second plate 22B.

Further, the first driver 23 moves the first plate 21B in the X direction and the Z direction (approaching and receding directions). That is, the first plate 21B moves in a multiaxial direction (the X direction and the Z direction). Further, the second driver 24 moves the second plate 22B in the X direction. That is, the second plate 22B moves in a uniaxial direction (the X direction).

FIG. 9A shows a state in which the first plate 21B is brought close to the second plate 22B, in other words, a state in which the first plate 21B is lowered. FIG. 9B shows a state in which the first plate 21B is moved away from the second plate 22B, in other words, a state in which the first plate 21B is raised. FIG. 10A shows the shielding member 20B when seen from the target 31 in the state of FIG. 9A. FIG. 10B shows the shielding member 20B when seen from the target 31 in the state of FIG. 9B.

With such a configuration, in the substrate processing apparatus 1, the protruding part 211B seen from the target 31 is enlarged by separating the first plate 21B from the second plate 22B. Thus, as shown in FIGS. 10A and 10B, the opening width can be narrowed from the opening width L1 to the opening width L2 at the center portion of the slit 200B in the Y direction. Further, in the substrate processing apparatus 1, the protruding part 211B seen from the target 31 is reduced by bringing the first plate 21B close to the second plate 22B. Thus, as shown in FIGS. 10A and 10B, the opening width can be widened from the opening width L2 to the opening width L1 at the center portion of the slit 200B in the Y direction.

Further, the substrate processing apparatus 1 can change a distance between the target 31 and the slit 200B in the X direction by moving the first plate 21B and the second plate 22B together. Thus, the angle of incidence of the sputtered particles which pass through the slit 200B and are obliquely incident on the substrate W can be adjusted.

Further, the controller 70 may raise the first plate 21B according to the progress of the target life. Thus, it is possible to suppress an increase in the film thickness distribution due to the progress of the target life. In other words, the uniformity of the film thickness can be improved.

Shielding Member 20C of Fourth Embodiment

Figure 11A:
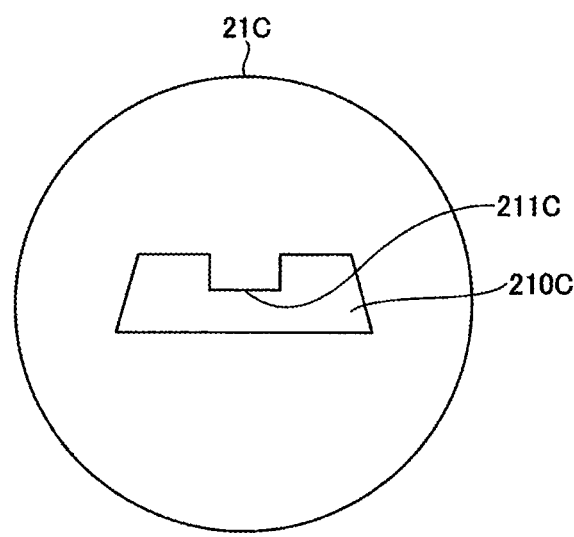
FIGS. 11A and 11B are examples of a plan view of a first plate and a second plate of a fourth embodiment.
Figure 11B:
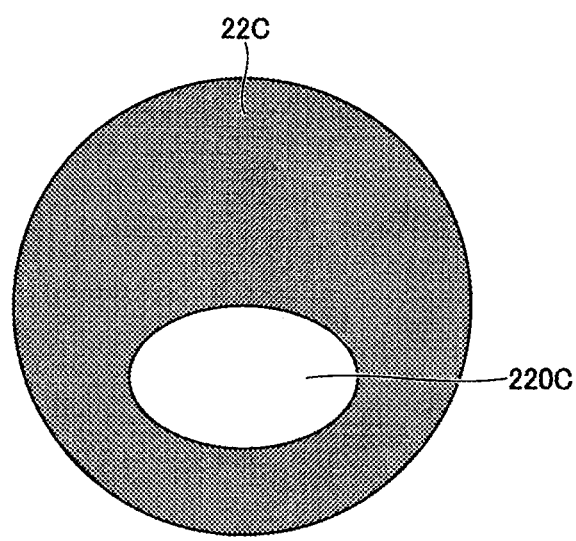

Next, a shielding member 20C of the substrate processing apparatus 1 according to a fourth embodiment will be described with reference to FIGS. 11 to 13. FIGS. 11A and 11B are examples of a plan view of a first plate 21C and a second plate 22C of the fourth embodiment. FIGS. 12A to 12D are examples of a plan view and a cross-sectional view of the shielding member 20C of the fourth embodiment. FIGS. 13A to 13D are examples of a plan view and a cross-sectional view of the shielding member 20C of the fourth embodiment. In FIGS. 11 to 13, dots are hatched on a surface of the second plate 22C to clearly indicate the surface.

The shielding member 20C according to the fourth embodiment includes the first plate (the first shielding member) 21C and the second plate (the second shielding member) 22C.

As shown in FIG. 11A, a thin elongated substantially rectangular opening 210C of which a longitudinal direction is the Y direction is formed in the first plate 21C. Further, at an edge of the opening 210C on one side in the X direction, a protruding part 211C is formed at a center portion in the Y direction. An opening shape (an opening area) of the opening 210C is adjusted by forming the protruding part 211C to protrude toward the opening 210C. In other words, an opening width of the opening 210C in the X direction is formed so that the center portion in the Y direction is narrow and the outer side in the Y direction is wide.

As shown in FIG. 11B, a thin elongated elliptical opening 220C of which a longitudinal direction is the Y direction is formed in the second plate 22C. The opening 220C is formed at a position deviated from a rotation center of the second plate 22B.

Further, the first driver 23 moves the first plate 21C in the X direction and rotates the first plate 21C. That is, the first plate 21C is moved in the uniaxial direction (the X direction) and is rotated. Further, the second driver 24 rotates the second plate 22C. That is, the second plate 22C is rotated.

FIGS. 12A and 12B show a first state of the shielding member 20C. In the first state, the second plate 22C is rotated, and the opening 220C is disposed on the side far from the target 31 side. Thus, the angle of incidence of the sputtered particles can be limited to a low angle of incidence. Further, the first plate 21C is disposed at a position at which the protruding part 211C does not block the sputtered particles passing through the opening 220C.

FIGS. 12C and 12D show a second state of the shielding member 20C. In the second state, the first plate 21C is moved (refer to a white arrow), and the first plate 21C is disposed at a position where the protruding part 211C blocks some of the sputtered particles passing through the opening 220C. Thus, the film thickness distribution can be adjusted by the protruding part 211C covering the center portion of the slit 200C in the Y direction.

Figure 13A:
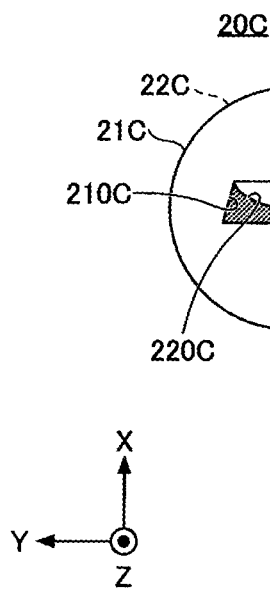
FIGS. 13A to 13D are examples of a plan view and a cross-sectional view of the slit plate of the fourth embodiment.
Figure 13B:
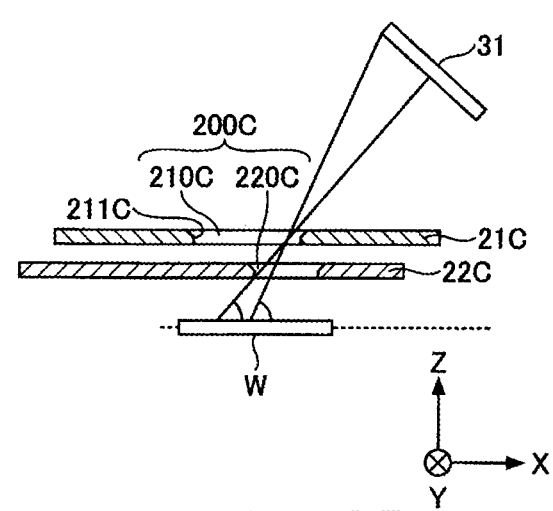

FIGS. 13A and 13B show a third state of the shielding member 20C. In the third state, the second plate 22C is rotated, and the opening 220C is disposed on the side close to the target 31 side. Thus, the angle of incidence of the sputtered particles can be limited to a high angle of incidence. Further, the first plate 21 is disposed at a position where the protruding part 211C does not block the sputtered particles passing through the opening 220C.

Figure 13C:
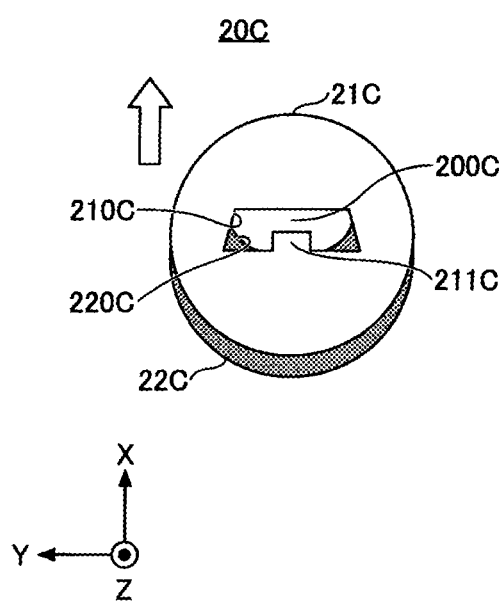
Figure 13D:
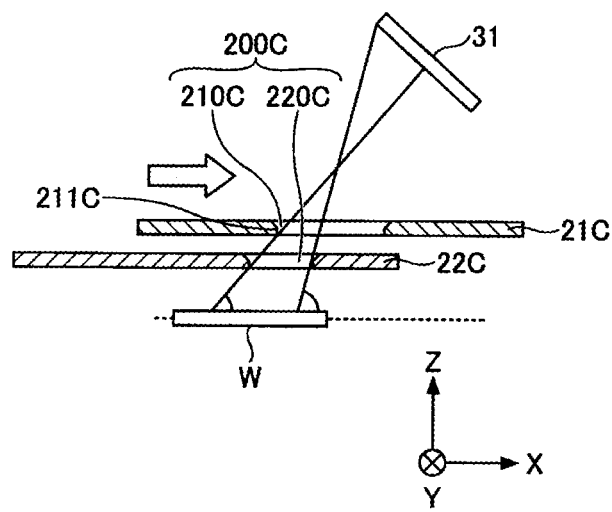

FIGS. 13C and 13D show a fourth state of the shielding member 20C. In the fourth state, the first plate 21 is moved (refer to a white arrow), and the first plate 21 is disposed at a position where the protruding part 211C blocks some of the sputtered particles passing through the opening 220C. Thus, the film thickness distribution can be adjusted by the protruding part 211C covering the center portion of the slit 200C in the Y direction.

That is, the angle of incidence of the sputtered particles can be controlled to a low angle of incidence (refer to FIGS. 12A to 12D) or a high angle of incidence (refer to FIGS. 13A to 13D) by rotating the second plate 22C. Then, the protruding part 211C covers the center portion of the slit 200C in the Y direction by moving the first plate 21C, and thus the film thickness distribution can be adjusted.

Although the substrate processing apparatus 1 has been described above, the present disclosure is not limited to the above-described embodiments and the like, and various modifications and improvements can be made within the scope of the gist of the present disclosure described in the claims.

What is claimed is:

1. A sputtering apparatus comprising:
    a processing chamber including:
        a chamber main body with an open upper portion; and
        a cover provided to close the open upper portion of the chamber main body;
    a target from which sputtered particles are emitted;
    a substrate support configured to support a substrate;
    a substrate moving mechanism configured to move the substrate in horizontal direction;
    a shielding member disposed between the target and the substrate support and having an opening through which the sputtered particles pass,
    wherein the shielding member includes a first shielding member, a second shielding member, and a third shielding member, the first shielding member arranged over the second shielding member, the second shielding member arranged over the third shielding member, and the third shielding member being apart from the substrate, and
    wherein an edge portion of the third shielding member is fixed to a side wall of the chamber main body;
    a target holder fixed on the cover, wherein the target holder holds the target on a front side of the target holder;
    a magnet disposed on a back side of the target holder and configured to reciprocate;
    a first driver configured to drive the first shielding member in horizontal direction; and
    a second driver configured to rotate the second shielding member, the second shielding member having a plate shape and rotating horizontally about an axis which is perpendicular to a top surface of the second shielding member.

2. The sputtering apparatus of claim 1, wherein the first driver moves the first shielding member in a moving direction of the substrate with respect to the second shielding member.

3. The sputtering apparatus of claim 1, wherein the first driver moves the first shielding member in a direction in which the first shielding member moves away from or approaches the second shielding member.

4. The sputtering apparatus of claim 2, wherein the first driver moves the first shielding member in a direction in which the first shielding member moves away from or approaches the second shielding member.

5. The sputtering apparatus of claim 1, further comprising a controller configured to control the driver,
    wherein the controller is configured to control the first driver and the second driver based on progress of consumption of the target.

6. The sputtering apparatus of claim 2, further comprising a controller configured to control the driver,
    wherein the controller is configured to control the first driver and the second driver based on progress of consumption of the target.

7. The sputtering apparatus of claim 5, wherein the first shielding member has a first opening having a protruding part,
    the second shielding member has a second opening, and
    the opening of the shielding member is formed by the first opening and the second opening.

8. The sputtering apparatus of claim 7, wherein the controller is configured to control the protruding part to protrude into the second opening based on the progress of consumption of the target.

9. The sputtering apparatus of claim 5, wherein the controller is configured to control the first driver and the second driver based on at least one of electric power supplied to the target, a discharge voltage, a current value supplied to the target, a temperature of cathode cooling water, and a torque of a motor of a magnet scanning mechanism.

10. The sputtering apparatus of claim 7, wherein the controller is configured to control the first driver and the second driver based on at least one of electric power supplied to the target, a discharge voltage, a current value supplied to the target, a temperature of cathode cooling water, and a torque of a motor of a magnet scanning mechanism.

11. The sputtering apparatus of claim 5, wherein the controller is configured to control the first driver and the second driver to close the opening of the shielding member.

12. The sputtering apparatus of claim 7, wherein the controller is configured to control the first driver and the second driver to close the opening of the shielding member.

13. A method of controlling a sputtering apparatus which includes:
    a processing chamber including:
        a chamber main body with an open upper portion; and
        a cover provided to close the open upper portion of the chamber main body;
    a target from which sputtered particles are emitted;
    a substrate support configured to support a substrate;
    a substrate moving mechanism configured to slide the substrate in horizontal direction;
    a shielding member disposed between the target and the substrate support, having an opening through which the sputtered particles pass, and including a first shielding member, a second shielding member, and a third shielding member, the first shielding member arranged over the second shielding member, the second shielding member arranged over the third shielding member, and the third shielding member being apart from the substrate,
    wherein an edge portion of the third shielding member is fixed to a side wall of the chamber main body;
    a target holder fixed on the cover, wherein the target holder holds the target on a front side of the target holder;
    a magnet disposed on a back side of the target holder and configured to reciprocate;

a first driver configured to drive the first shielding member in horizontal direction; and a second driver configured to rotate the second shielding member, the second shielding member having a plate shape and rotating horizontally about an axis which is perpendicular to a top surface of the second shielding member, wherein the method comprises controlling the driver based on progress of consumption of the target.

* * * * *